(12) United States Patent
Park et al.

(10) Patent No.: US 7,830,725 B2
(45) Date of Patent: Nov. 9, 2010

(54) PAGE BUFFER AND PROGRAMMING METHOD OF A NON-VOLATILE MEMORY DEVICE

(75) Inventors: Se Chun Park, Seoul (KR); Jong Hyun Wang, Cheongju-si (KR); Yu Jong Noh, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 161 days.

(21) Appl. No.: 12/130,981

(22) Filed: May 30, 2008

(65) Prior Publication Data

US 2009/0161444 A1 Jun. 25, 2009

(30) Foreign Application Priority Data

Dec. 24, 2007 (KR) ...................... 10-2007-0136373

(51) Int. Cl.
*G11C 7/10* (2006.01)

(52) U.S. Cl. ............................. 365/189.05; 365/189.12; 365/230.08; 365/235

(58) Field of Classification Search ............ 365/189.05, 365/203, 189.12, 230.08, 235
See application file for complete search history.

(56) References Cited

U.S. PATENT DOCUMENTS 7,269,064 B2 * 9/2007 Kim ...................... 365/185.12
7,333,365 B2 * 2/2008 Seong ................... 365/185.12
7,515,472 B2 * 4/2009 Chung ................... 365/185.21

FOREIGN PATENT DOCUMENTS

| KR | 100172406 B1 | 10/1998 |
| KR | 100204803 B1 | 3/1999 |
| KR | 1020050094569 A | 9/2005 |
| KR | 1020070068002 A | 6/2007 |

* cited by examiner

*Primary Examiner*—Pho M Luu
(74) *Attorney, Agent, or Firm*—Townsend and Townsend and Crew LLP

(57) ABSTRACT

A page buffer includes a first ground voltage supply unit for applying a ground voltage to first and second registers according to a level of a sense node, and a second ground voltage supply unit for applying the ground voltage to the first and second registers irrespective of a level of the sense node. A method of programming a non-volatile memory device includes storing a high-level data in a first node of a first register of a plurality of page buffers, precharging a sense node with a high level, resetting the data stored in the first node of the first register according to a voltage level of the sense node, precharging the sense node with a high level, storing external data in the first node according to a voltage level of the sense node, and performing a program operation according to the data stored in the first node.

7 Claims, 5 Drawing Sheets

FIG. 2

| C,D & A,B STATE | BL Erase cell | BL Program cell | S0 Erase cell | S0 Program cell | QA Erase cell | QA Program cell | QB Erase cell | QB Program cell |
|---|---|---|---|---|---|---|---|---|
| Case | | | | | | | | |
| Initial state | | | | | | | | |
| Highset QB | | | H | H | | | L | H |
| Data Input (to QB) | | | H | | | | H | L |
| Data transfer QB to QA | | | H | L | H | L | H | L |
| Program | H | L | L | L | H | L | L | L |
| Verify QA(normal 경우) | L | L→H | L→H | | L | L→H | L | L |

Status Pass ← L→H (QA Program cell, Verify QA row)

FIG. 3

| C,D & A,B STATE | BL Erase cell | BL Program cell | S0 Erase cell | S0 Program cell | QA Erase cell | QA Program cell | QB Erase cell | QB Program cell |
|---|---|---|---|---|---|---|---|---|
| Case | | | | | | | | |
| Initial state | | | | | | | | |
| Highset QB | | | L | L | | | L | L |
| Data Input (to QB) | | | L | L | | | H | L |
| Data transfer QB to QA | | | L | L | L | L | H | L |
| Program | H | L | L | L | L | L | H | L |
| Verify QA | L | L→H | L | L | L | L | L | L |

Status Fail caused ← L (QA Program cell, Verify QA row)

FIG. 5

| C,D & A,B STATE | BL | | S0 | | QA | | QB | |
|---|---|---|---|---|---|---|---|---|
| Case | Erase cell | Program cell | Erase cell | Program cell | Erase cell | Program cell | Erase cell | Program cell |
| Initial state | | | | | | | | |
| Highset QA,QB(PBSET turn on) | | | L | L | H | H | H | H |
| RESET QA | | | L | L | L | L | H | H |
| Data Input (to QB) | | | L | L | L | L | H | L |
| Data transfer QB to QA | | | L | L | H | L | H | L |
| Program | H | L | L | L | H | L | H | L |
| Verify QA | L | L→H | L | L | H | H (Status Pass) | H | L |

FIG. 6

| C,D & A,B STATE | BL | | S0 | | QA | | QB | |
|---|---|---|---|---|---|---|---|---|
| Case | Erase cell | Program cell | Erase cell | Program cell | Erase cell | Program cell | Erase cell | Program cell |
| Initial state | | | | | | | | |
| Highset QA,QB(PBSET turn on) | | | L | L | H | L | H | H |
| RESET QA | | | H | H | L | L | H | H |
| Data Input (to QB) | | | H | H | L | L | H | L |
| Data transfer QB to QA | | | H | L | H | L | H | L |
| Program | H | L | L | L | H | L | H | L |
| Verify QA | L | L→H | L | L→H | H | L→H (Status Pass) | H | L |

PAGE BUFFER AND PROGRAMMING METHOD OF A NON-VOLATILE MEMORY DEVICE

CROSS-REFERENCES TO RELATED APPLICATIONS

The present application claims priority to Korean patent application number 10-2007-0136373, filed on Dec. 24, 2007, which is incorporated by reference in its entirety.

BACKGROUND OF THE INVENTION

The present invention relates to a page buffer of a non-volatile memory device, which can output a verify completion signal even when a low-voltage fixing phenomenon of a sense node occurs.

In recent years, there has been an increasing demand for non-volatile memory devices which can be electrically programmed and erased and do not need a refresh function of rewriting data at specific intervals.

A non-volatile memory device generally includes a memory cell array in which cells for storing data are arranged in matrix form, and a page buffer for writing memory into specific cells of the memory cell array or reading memory stored in a specific cell. The page buffer includes a bit line pair connected to a specific memory cell, a register for temporarily storing data to be written into the memory cell array therein, or reading data of a specific cell from the memory cell array and temporarily storing the read data therein, a sense node for sensing the voltage level of a specific bit line or a specific register, and a bit line select unit for controlling whether the specific bit line is connected to the sense node.

While the non-volatile memory device operates, the voltage level of the sense node is fixed to a low level. This is called low-voltage fixing of the sense node. This occurs because neighboring sense nodes are shorted since page buffers are arranged densely due to a reduction in process dimensions. Accordingly, a problem arises because the voltage level of the sense node is fixed to a low level even though an attempt is made to precharge the sense node to a high level by applying a precharge signal PRECH_N.

BRIEF SUMMARY OF THE INVENTION

The present invention is directed to a page buffer which can change data stored in a register irrespective of the voltage level of a sense node.

The present invention is also directed to a method of programming a non-volatile memory device including the page buffer.

A page buffer according to an aspect of the present invention includes a first ground voltage supply unit for applying a ground voltage to first and second registers according to a level of a sense node, and a second ground voltage supply unit for applying the ground voltage to the first and second registers irrespective of a level of the sense node.

A method of programming a non-volatile memory device according to another aspect of the present invention includes storing a high-level data in a first node of a first register of each page buffer, precharging a sense node to a high level, resetting the data stored in the first node of the first register according to a voltage level of the sense node, precharging the sense node with a high level, storing external data in the first node of the first register according to a voltage level of the sense node, and performing a program operation according to the data stored in the first node of the first register.

BRIEF DESCRIPTION OF THE DRAWINGS

FIG. 2 is a view showing voltages applied to respective nodes during a program operation of a typical non-volatile memory device;

FIG. 3 is a view showing voltages applied to respective nodes when a low-voltage fixing phenomenon of a sense node occurs during a program operation of a typical non-volatile memory device;

FIG. 5 is a view showing voltages applied to respective nodes when a low-voltage fixing phenomenon of a sense node occurs while the page buffer according to an embodiment of the present invention operates;

FIG. 6 is a view showing voltages applied to respective nodes when a low-voltage fixing phenomenon does not occur in a sense node while the page buffer according to an embodiment of the present invention operates.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1:
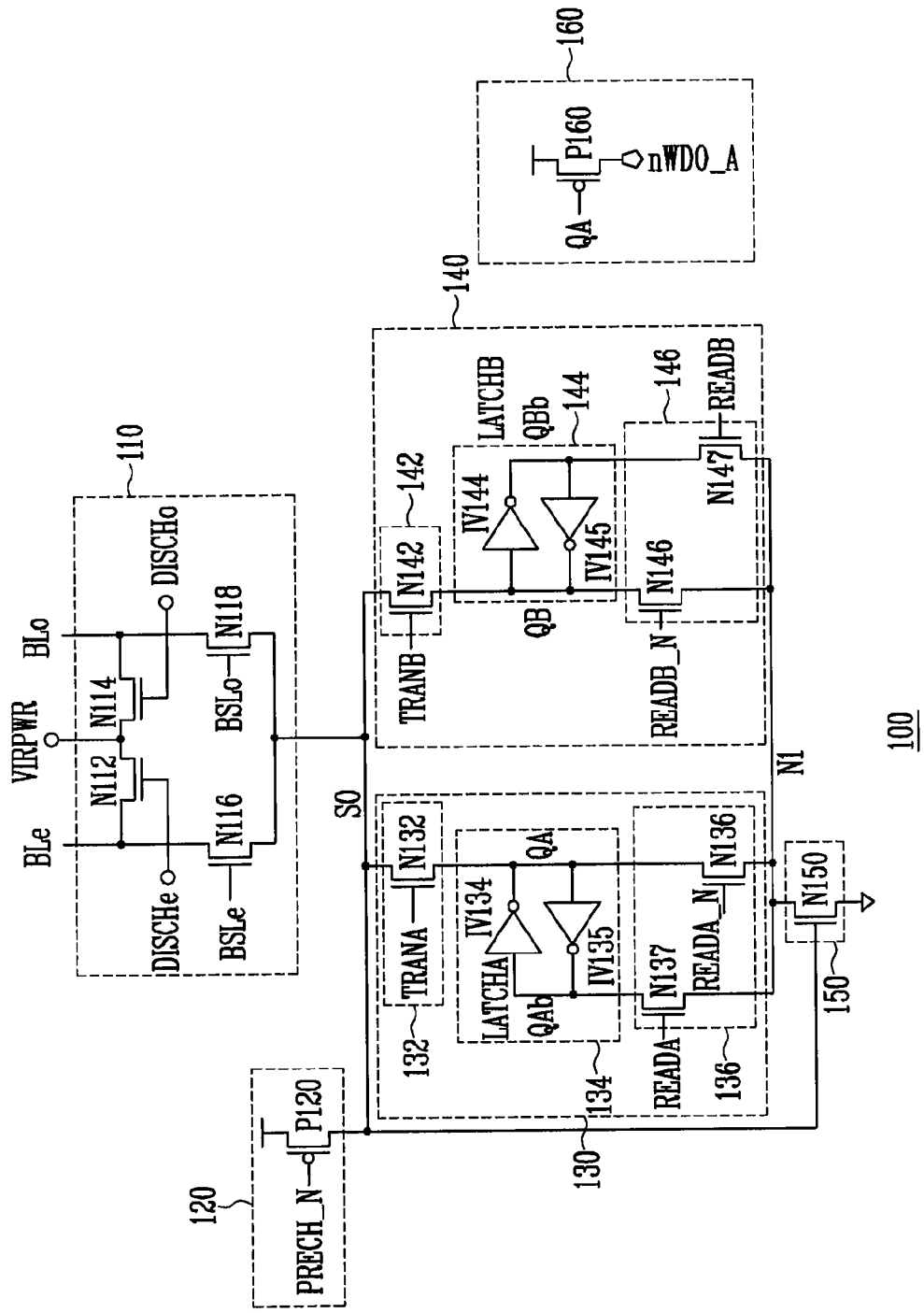
FIG. 1 is a circuit diagram showing a page buffer of a non-volatile memory device according to an embodiment of the present invention.

FIG. 1 is a circuit diagram showing a page buffer of a non-volatile memory device according to an embodiment of the present invention.

A page buffer 100 includes a bit line select unit 110 for selectively connecting a bit line connected to a specific cell to a sense node, a sense node precharge unit 120 for applying a power supply voltage of a high level to the sense node, a first register 130 and a second register 140 for temporarily storing data to be programmed into a specific cell and temporarily storing data read from a specific cell, a ground voltage supply unit 150 for applying a ground voltage to the register according to a level of the sense node, and a verify signal output unit 160 for informing whether verification has been completed according to data stored in the specific registers 130, 140.

The bit line select unit 110 includes a NMOS transistor N116 for connecting an even bit line BLe and a sense node SO in response to a first bit line select signal BSLe, and a NMOS transistor N118 for connecting an odd bit line BLo and the sense node SO in response to a second bit line select signal BSLo.

The bit line select unit 110 further includes a variable voltage input terminal for applying a variable voltage VIRPWR of a specific level, a NMOS transistor N112 for connecting the even bit line BLe and the variable voltage input terminal in response to a first discharge signal DISCHe, and a NMOS transistor N114 for connecting the odd bit line BLo and the variable voltage input terminal in response to a second discharge signal DISCHo.

The sense node precharge unit 120 applies a high-level voltage VDD to the sense node SO in response to a precharge signal PRECH_N. The sense node precharge unit 120 includes a PMOS transistor P120 connected between the power supply voltage terminal VDD and the sense node SO. Thus, the sense node precharge unit 120 applies the power supply voltage of a high level to the sense node SO in response to the precharge signal of a low level.

However, as described above, the phenomenon in which the sense node is fixed to a low voltage is also generated by the precharge signal.

The first register 130 functions to temporarily store data to be programmed into a specific cell or temporarily store data read from a specific cell. The first register 130 includes a first latch 134 for storing data therein, a first data setting unit 136 for inputting data to be stored in the first latch, and a first data transfer unit 132 for applying data stored in the first latch to the sense node SO.

The first latch 134 includes a first inverter IV134 and a second inverter IV135. An output terminal of the first inverter IV134 is connected to an input terminal of the second inverter IV135, and an input terminal of the first inverter IV134 is connected to an output terminal of the second inverter IV135. A node at which the output terminal of the first inverter IV134 is connected to the input terminal of the second inverter IV135 is called a first node QA, and a node at which the output terminal of the second inverter IV135 is connected to the input terminal of the first inverter IV134 is called a second node QAb.

For example, when the first node QA is applied with a high-level data, the high-level data is inverted by the second inverter IV135 and an inverted low-level data is then input to the second node QAb. The low-level data is inverted by the first inverter IV134, so the high-level data applied to the first node QA remains intact. This phenomenon is called a data retention effect. In contrast, when the first node QA is applied with a low-level data, the low-level data is inverted by the second inverter IV135 and an inverted high-level data is input to the second node QAb. The high-level data is inverted by the first inverter IV134, so the low-level data applied to the first node QA remains intact. This phenomenon is also called a data retention effect.

The first data setting unit 136 includes a first data setting transistor N136 for applying the ground voltage to the first node QA of the first latch 134, and a second data setting transistor N137 for applying the ground voltage to the second node QAb.

The first data setting transistor N136 is connected between the first ground voltage supply unit 150 and the first node QA and applies the ground voltage received from the first ground voltage supply unit 150 to the first node QA in response to a first data setting signal READA_N.

Further, the second data setting transistor N137 is connected between the first ground voltage supply unit 150 and the second node QAb and applies the ground voltage received from the first ground voltage supply unit 150 to the second node QAb in response to a second data setting signal READA.

A first data transfer unit 132 selectively applies data, which is stored in the first node QA of the first latch 134, to the sense node SO. The first data transfer unit 132 includes a first data transfer transistor N132 for selectively connecting the first node QA and the sense node SO according to a first transfer signal TRANA.

The second register 140 functions to temporarily store data to be programmed into a specific cell and temporarily store data read from a specific cell. The second register 140 includes a second latch 144 for storing data therein, a second data setting unit 146 for inputting data to be stored in the second latch 144, and a second data transfer unit 142 for applying data stored in the second latch 144 to the sense node SO.

The second latch 144 includes a first inverter IV144 and a second inverter IV145. An output terminal of the first inverter IV144 is connected to an input terminal of the second inverter IV145. An output terminal of the second inverter IV145 is connected to an input terminal of the first inverter IV144. A node at which the output terminal of the second inverter IV145 is connected to the input terminal of the first inverter IV144 is called a first node QB. A node at which the output terminal of the first inverter IV144 is connected to the input terminal of the second inverter IV145 is called a second node QBb.

For example, when the first node QB is applied with a high-level data, the high-level data is inverted by the first inverter and the inverted low-level data is then applied to the second node QBb. The low-level data is inverted by the second inverter, so the high-level data applied to the first node QB remains intact. In contrast, when the first node QB is applied with a low-level data, the low-level data is inverted by the first inverter and an inverted high-level data is then applied to the second node QBb. The high-level data is inverted by the second inverter, so the low-level data applied to the first node QB remains intact.

The second data setting unit 146 includes a first data setting transistor N146 for applying a ground voltage to the first node QB of the first latch 144, and a second data setting transistor N147 for applying the ground voltage to the second node QBb.

The first data setting transistor N146 is connected between the first ground voltage supply unit 150 and the first node QB, and applies the ground voltage received from the first ground voltage supply unit 150 to the first node QB in response to a first data setting signal READB_N.

Further, the second data setting transistor N147 is connected between the first ground voltage supply unit 150 and the second node QBb, and applies the ground voltage received from the first ground voltage supply unit 150 to the second node QBb in response to a second data setting signal READB.

The second data transfer unit 142 selectively applies data stored in the first node QB of the second latch 144 to the sense node SO. The second data transfer unit 142 includes a second data transfer transistor N142 for selectively connecting the first node QB and the sense node SO according to a second transfer signal TRANB.

The ground voltage supply unit 150 applies the ground voltage to the first data setting unit 136 and the second data setting unit 146 according to a voltage level of the sense node SO. The ground voltage supply unit 150 includes a NMOS transistor N150 connected between the first data setting unit 136, the second data setting unit 146 and the ground terminal. That is, the NMOS transistor N150 is connected between the ground terminal and a node N1 at which one terminal of the transistors of the first data setting unit 136 and one terminal of the transistors of the second data setting unit 146 are connected.

The ground voltage supply unit 150 applies the ground voltage to the first data setting unit 136 and the second data setting unit 146 according to a voltage level of the sense node SO. When a voltage level of the sense node SO is a high level, the ground voltage supply unit 150 applies the ground voltage to the first and second data setting units 136, 146. When the first data setting signal READA_N or READB_N of a high level is applied, the ground voltage is applied to the first node QA or QB. It is considered that a low-level data has been applied to the first node QA or QB. However, when the second data setting signal READA or READB of a high level is applied, the ground voltage is applied to the second node QAb or QBb. It is considered that a high-level data has been applied to the first node QA or QB.

The verify signal output unit 160 outputs a signal to indicate whether verification has been completed according to data stored in the first node QA or QB of the first or second register. The verify signal output unit 160 includes a PMOS transistor P160 for transferring the power supply voltage of a high level to a verify signal output terminal nWDO according to a signal of the first node QA or QB.

Alternatively, instead of the PMOS transistor P160, a NMOS transistor may be used for transferring the power supply voltage of a high level to the verify signal output terminal nWDO according to a signal of the second node QAb or QBb.

As described above, problems that arise when the low-voltage fixing phenomenon of the sense node occurs in the operation of the page buffer are described below.

FIG. 2 is a view showing voltages applied to respective nodes during a program operation of a typical non-volatile memory device.

It is first assumed that in an initial state, a low level L is set to the first node QA of the first register 130 and the first node QB of the second register 140 irrespective of a to-be-programmed state.

A high level H is then set to the first node QB of the second register 140 irrespective of a to-be-programmed state.

When the sense node SO is precharged to a high level, the second data setting signal READB is applied to the second register 140. Accordingly, the ground voltage is applied to the second node QBb of the second latch, so data set in the first node QB is changed to a high level. Data set in the first node QA of the first register 130 maintains a low level without being changed.

Data to determine whether a specific cell has been programmed is then applied to the second register 140. When a corresponding cell is erased, a high-level data is applied to the first node QB, and when a corresponding cell is programmed, a low-level data is applied to the first node QB.

The data stored in the second register 140 is transferred to the first register 130. The second transfer signal TRANB is applied to the second register 140, so the data stored in the first node QB is applied to the gate of the ground voltage supply unit 150. If the second data setting signal READA is applied, data transferred to the first node QA of the first register 130 is changed according to data stored in the first node QB. In other words, when a high-level data is stored in the first node QB of the second register 140, the ground voltage supply unit 150 is driven to apply the ground voltage to the second node QAb and a high-level data is stored in the first node QA of the first register 130. However, when a low-level data is stored in the first node QB of the second register 140, the ground voltage supply unit 150 is not driven, so the ground voltage is not supplied to the second node QAb and the low-level data stored in the first node QA of the first register 130 remains intact.

A program operation is then executed according to data stored in the first node QA of the first register. That is, when data stored in the first node QA is a low-level data, a corresponding cell becomes a programming subject, and when data stored in the first node QA is a high-level data, a corresponding cell becomes an erase subject.

A verify operation for checking the program is then performed.

In a verify operation, when a to-be-programmed cell is not programmed over a verify voltage supplied from a word line, a corresponding cell is turned on, thereby forming a current path over all of the cell strings. The sense node precharged with a high level is grounded to the ground terminal connected to the cell string, so the sense node shifts to a low level. Further, in the case of a cell not to be programmed, the threshold voltage of a corresponding cell is a verify voltage or less. Thus, a current path is formed over all of the cell strings, so the sense node shifts to a low level. Accordingly, data that was first stored remains intact.

However, when a to-be-programmed cell is programmed over a verify voltage, a corresponding cell is turned off and formation of a current path is shut off. Thus, the sense node maintains a high-level voltage. When the second data transfer signal READA is applied, a low-level data stored upon programming changes to a high-level data.

When verification is completed, data stored in the first node QA is a high-level data irrespective of whether a corresponding cell is a to-be-programmed cell. As described above, in the case of a to-be-erased cell, the sense node maintains a low level, so the high-level data that was first stored remains intact. Further, in the case of a to-be-programmed cell, when program is completed, the sense node shifts to a high level and the low-level data that was first stored changes to a high level. Thus, if a high-level data is set in the first node of the first register of the entire page buffer, verification is completed. However, when the low-voltage fixing phenomenon of the sense node occurs, verification may not be normally completed.

FIG. 3 is a view showing voltages applied to respective nodes when the low-voltage fixing phenomenon of a sense node occurs during a program operation of a typical non-volatile memory device.

When the low-voltage fixing phenomenon of the sense node is generated, a low-level voltage is applied to the sense node irrespective of an operation.

It is first assumed that in an initial state, a low level L is set to the first node QA of the first register 130 and the first node QB of the second register 140 irrespective of a to-be-programmed state.

A high level H is then set to the first node QB of the second register 140 irrespective of a to-be-programmed state.

The setting method is the same as that of FIG. 2.

Data to determine whether a specific cell has been programmed is then applied to the second register 140. When a corresponding cell is erased, a high-level data is applied to the first node QB, and when a corresponding cell is programmed, a low-level data is applied to the first node QB.

The data stored in the second register 140 is transferred to the first register 130. The second transfer signal TRANB is applied to the second register 140. However, although the high-level data stored in the second register is applied to the sense node, the ground voltage supply unit 150 is not driven since the sense node maintains a low-level voltage.

Thus, the low-level data that was first stored remains intact in the first register. That is, external data is stored only in the second register, but is not transferred to the first register.

A program operation is then executed according to data stored in the first node QA of the first register. Cells are all to-be-programmed cells because the low-level data is stored in the first node QA.

A verify operation for checking whether the program has been completed is then performed.

The ground voltage supply unit 150 is not driven because the sense node has a low-level voltage irrespective of whether a corresponding cell has been programmed. Thus, the low-level data stored in the first node QA of the first register remains intact. If the low-level data is maintained in the first node QA as described above, the PMOS transistor of the verify signal output unit 160 is turned on to output a high-level voltage.

The verify signal output unit 160 is included in each page buffer. Thus, respective output signals from the verify signal output units 160 are connected in parallel and output as one signal. When verification is completed, that is, when a high-level data is applied to the first nodes QA of the page buffers, the respective verify signal output units are turned off and therefore become a floating state. The ground voltage is applied to the output terminals of the floating state, so a low-level voltage is output from the output terminals. However, if a low-level data is applied to the first node QA of a specific page buffer due to the low-voltage fixing phenomenon of the sense node as described above, the verify signal output unit is turned on to output a high-level voltage, so that the first node QA does not become a floating state. That is, if the low-voltage fixing phenomenon of the sense node is generated in any page buffer, verification of the page buffers fails.

To solve this problem, there is a need for a page buffer for preventing the influence of the low-voltage fixing phenomenon of the sense node.

Figure 4:
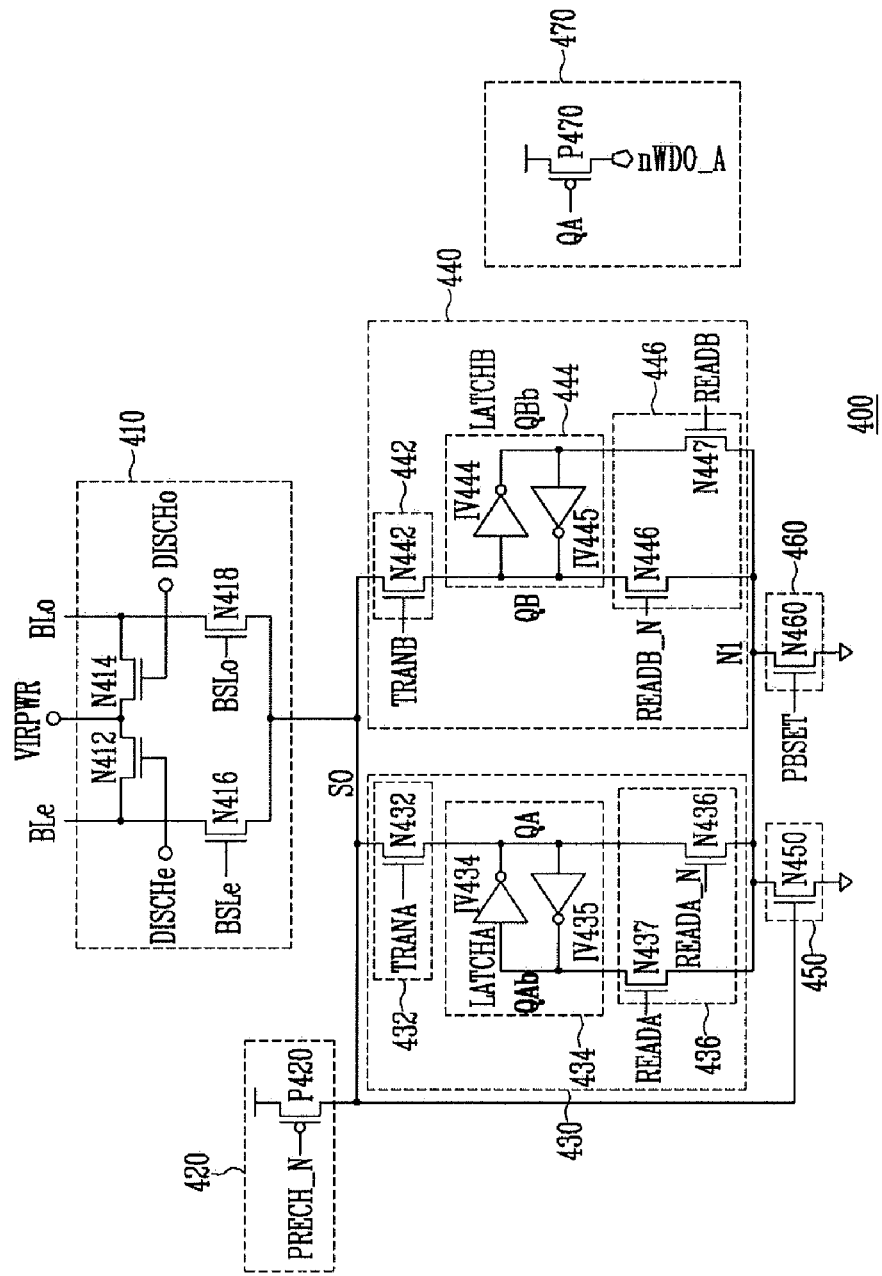
FIG. 4 is a circuit diagram showing a page buffer of a non-volatile memory device according to another embodiment of the present invention.

FIG. 4 is a circuit diagram showing a page buffer of a non-volatile memory device according to another embodiment of the present invention.

A page buffer 400 includes a bit line select unit 410 for selectively connecting a bit line connected to a specific cell to a sense node, a sense node precharge unit 420 for applying a power supply voltage of a high level to the sense node, a first register 430 and a second register 440 for temporarily storing data to be programmed into a specific cell and temporarily storing data read from a specific cell, a ground voltage supply unit 450 for applying a ground voltage to the register according to a level of the sense node, and a verify signal output unit 470 for informing whether verification has been completed according to data stored in the specific registers 430, 440.

According to an embodiment of the present invention, the page buffer 400 further includes a second ground voltage supply unit 460 for applying the ground voltage to the register even when the low-voltage fixing phenomenon of the sense node is generated.

The bit line select unit 410 includes a NMOS transistor N416 for connecting an even bit line BLe and a sense node SO in response to a first bit line select signal BSLe, and a NMOS transistor N418 for connecting an odd bit line BLo and the sense node SO in response to a second bit line select signal BSLo.

The bit line select unit 410 further includes a variable voltage input terminal for applying a variable voltage VIRPWR of a specific level, a NMOS transistor N412 for connecting the even bit line BLe and the variable voltage input terminal in response to a first discharge signal DISCHe, and a NMOS transistor N414 for connecting the odd bit line BLo and the variable voltage input terminal in response to a second discharge signal DISCHo.

The sense node precharge unit 420 applies a high-level voltage VDD to the sense node SO in response to a precharge signal PRECH_N. The sense node precharge unit 420 includes a PMOS transistor P420 connected between the power supply voltage terminal VDD and the sense node SO.

Thus, the sense node precharge unit 420 applies the power supply voltage of a high level to the sense node SO in response to the precharge signal of a low level.

However, as described above, the phenomenon in which the sense node is fixed to a low voltage is also generated by the precharge signal.

The first register 430 functions to temporarily store data to be programmed into a specific cell or temporarily store data read from a specific cell. The first register 430 includes a first latch 434 for storing data therein, a first data setting unit 436 for inputting data to be stored in the first latch, and a first data transfer unit 432 for applying data stored in the first latch to the sense node SO.

The first latch 434 includes a first inverter IV434 and a second inverter IV435. An output terminal of the first inverter IV434 is connected to an input terminal of the second inverter IV435, and an input terminal of the first inverter IV434 is connected to an output terminal of the second inverter IV435. A node at which the output terminal of the first inverter IV434 is connected to the input terminal of the second inverter IV435 is called a first node QA, and a node at which the output terminal of the second inverter IV435 is connected to the input terminal of the first inverter IV434 is called a second node QAb.

For example, when the first node QA is applied with a high-level data, the high-level data is inverted by the second inverter IV435 and an inverted low-level data is then input to the second node QAb. The low-level data is inverted by the first inverter IV434, so the high-level data applied to the first node QA remains intact. This phenomenon is called a data retention effect. In contrast, when the first node QA is applied with a low-level data, the low-level data is inverted by the second inverter IV435 and an inverted high-level data is input to the second node QAb. The high-level data is inverted by the first inverter IV434, so the low-level data applied to the first node QA remains intact. This phenomenon is also called a data retention effect.

The first data setting unit 436 includes a first data setting transistor N436 for applying the ground voltage to the first node QA of the first latch 434, and a second data setting transistor N437 for applying the ground voltage to the second node QAb.

The first data setting transistor N436 is connected between the first ground voltage supply unit 450 and the first node QA and applies the ground voltage received from the first ground voltage supply unit 450 to the first node QA in response to a first data setting signal READA_N.

Further, the second data setting transistor N437 is connected between the first ground voltage supply unit 450 and the second node QAb, and applies the ground voltage received from the first ground voltage supply unit 450 to the second node QAb in response to a second data setting signal READA.

A first data transfer unit 432 selectively applies data, which is stored in the first node QA of the first latch 434, to the sense node SO. The first data transfer unit 432 includes a first data transfer transistor N432 for selectively connecting the first node QA and the sense node SO according to a first transfer signal TRANA.

The second register 440 functions to temporarily store data to be programmed into a specific cell and temporarily store data read from a specific cell. The second register 440 includes a second latch 444 for storing data therein, a second data setting unit 446 for inputting data to be stored in the second latch 444, and a second data transfer unit 442 for applying data that is stored in the second latch 444 to the sense node SO.

The second latch 444 includes a first inverter IV444 and a second inverter IV445. An output terminal of the first inverter IV444 is connected to an input terminal of the second inverter IV445. An output terminal of the second inverter IV445 is connected to an input terminal of the first inverter IV444. A node at which the output terminal of the second inverter IV445 is connected to the input terminal of the first inverter IV444 is called a first node QB. A node at which the output terminal of the first inverter IV444 is connected to the input terminal of the second inverter IV445 is called a second node QBb.

For example, when the first node QB is applied with a high-level data, the high-level data is inverted by the first inverter and the inverted low-level data is then applied to the second node QBb. The low-level data is inverted by the second inverter, so the high-level data applied to the first node QB remains intact. In contrast, when the first node QB is applied with a low-level data, the low-level data is inverted by the first inverter and an inverted high-level data is then applied to the second node QBb. The high-level data is inverted by the second inverter, so the low-level data applied to the first node QB remains intact.

The second data setting unit 446 includes a first data setting transistor N446 for applying a ground voltage to the first node QB of the first latch 444, and a second data setting transistor N447 for applying the ground voltage to the second node QBb.

The first data setting transistor N446 is connected between the first ground voltage supply unit 450 and the first node QB, and applies the ground voltage received from the first ground voltage supply unit 450 to the first node QB in response to a first data setting signal READB_N.

Further, the second data setting transistor N447 is connected between the first ground voltage supply unit 450 and the second node QBb, and applies the ground voltage received from the first ground voltage supply unit 450 to the second node QBb in response to a second data setting signal READB.

The second data transfer unit 442 selectively applies data that is stored in the first node QB of the second latch 444 to the sense node SO. The second data transfer unit 442 includes a second data transfer transistor N442 for selectively connecting the first node QB and the sense node SO according to a second transfer signal TRANB.

The ground voltage supply unit 450 applies the ground voltage to the first data setting unit 436 and the second data setting unit 446 according to a voltage level of the sense node SO. The ground voltage supply unit 450 includes a NMOS transistor N450 connected between the first data setting unit 436, the second data setting unit 446 and the ground terminal. That is, the NMOS transistor N450 is connected between the ground terminal and a node N1 at which one terminal of the transistors of the first data setting unit 436 and one terminal of the transistors of the second data setting unit 446 are connected.

The ground voltage supply unit 450 applies the ground voltage to the first data setting unit 436 and the second data setting unit 446 according to a voltage level of the sense node SO. When a voltage level of the sense node SO is a high level, the ground voltage supply unit 450 applies the ground voltage to the first and second data setting units 436, 446. When the first data setting signal READA_N or READB_N of a high level is applied, the ground voltage is applied to the first node QA or QB. It is considered that a low-level data has been applied to the first node QA or QB. However, when the second data setting signal READA or READB of a high level is applied, the ground voltage is applied to the second node QAb or QBb. It is considered that a high-level data has been applied to the first node QA or QB.

The second ground voltage supply unit 460 applies the ground voltage to the first data setting unit 436 and the second data setting unit 446 according to an additional control signal PBSET applied from a controller of the non-volatile memory device irrespective of a voltage level of the sense node. The second ground voltage supply unit 460 includes a NMOS transistor N460. The NMOS transistor N460 is connected between the first data setting unit 436, the second data setting unit 446 and the ground terminal, and is turned on according to the control signal PBSET. That is, the NMOS transistor N460 is connected between the ground terminal and a node N1 at which one terminal of the transistors of the first data setting unit 436 and one terminal of the transistors of the second data setting unit 446 are connected. Thus, the NMOS transistor N450 of the first ground voltage supply unit 450 and the NMOS transistor N460 of the second ground voltage supply unit 460 are connected in parallel between the node N1 and the ground terminal.

Accordingly, the second ground voltage supply unit 460 applies the ground voltage to the first data setting unit and the second data setting unit according to the control signal PBSET irrespective of a voltage level of the sense node. When the control signal PBSET is a high level, the second ground voltage supply unit 460 applies the ground voltage to the first and second data setting units. When the first data setting signal READA_N or READB_N of a high level is applied, the ground voltage is applied to the first node QA or QB. It is considered that a low-level data has been applied to the first node QA or QB. However, when the second data setting signal READA or READB of a high level is applied, the ground voltage is applied to the second node QAb or QBb. It is considered that a high-level data has been applied to the first node QA or QB.

The verify signal output unit 467 outputs a signal to indicate whether verification has been completed according to data stored in the first node QA or QB of the first or second register. The verify signal output unit 470 includes a PMOS transistor P470 for transferring the power supply voltage of a high level to a verify signal output terminal nWDO according to a signal of the first node QA or QB.

Alternatively, instead of the PMOS transistor P470, a NMOS transistor may be used for transferring the power supply voltage of a high level to the verify signal output terminal nWDO according to a signal of the second node QAb or QBb.

An operation of the page buffer constructed above is described below in detail.

FIG. 5 is a view showing voltages applied to respective nodes when the low-voltage fixing phenomenon of the sense node occurs while the page buffer according to an embodiment of the present invention operates. FIG. 6 is a view showing voltages applied to respective nodes when the low-voltage fixing phenomenon of the sense node does not occur while the page buffer according to an embodiment of the present invention operates.

When the low-voltage fixing phenomenon of the sense node is generated, a low-level voltage is applied to the sense node irrespective of an operation.

First, in an initial state, it is assumed that a low level L is set to the first node QA of the first register and the first node QB of the second register irrespective of a to-be-programmed state.

A high level H is then set to the first node QA of the first register and the first node QB of the second register irrespective of a to-be-programmed state.

The control signal PBSET is applied to the second ground voltage supply unit 460 so that the ground voltage is transferred to the first data setting unit 436 and the second data setting unit 446. When the second data setting signal READA is applied to the first register and the second data setting signal READB is applied to the second register, a high-level data can be supplied to the first node QA and QB of each register.

This is for the purpose of storing the high-level data in the first register, which becomes a reference for the output of the verify signal. This is because the high-level data cannot be supplied to the first node of the first register in the verify process due to low-voltage fixing of the sense node. The process is performed on the first registers irrespective of whether the low-voltage fixing phenomenon of the sense node has occurred.

The data stored in the first register is reset to a low level.

The sense node is precharged with a high level so that the ground voltage is transferred to the first data setting unit 436 through the first ground voltage supply unit 450. When the first data setting signal READA_N is applied to the first register, a low-level data can be applied to the first node QA of each register (in the case of FIG. 6).

However, when the low-voltage fixing phenomenon of the sense node occurs, the first ground voltage supply unit 450 is not driven. Thus, the data stored in the first register is not reset to a low level (in the case of FIG. 5).

Accordingly, it is determined whether the low-voltage fixing phenomenon of the sense node has occurred according to the process. When the data stored in the first node of the first register maintains a high level, it can be considered that the low-voltage fixing phenomenon of the sense node has occurred according to the reset process.

Data to determine whether a specific cell has been programmed is supplied to the second register. When a corresponding cell is erased, a high-level data is applied to the first node QB and when a corresponding cell is programmed, a low-level data is applied to the first node QB.

The data stored in the second register is then transferred to the first register. The second transfer signal TRANB is applied to the second register. Thus, the data stored in the first node QB is applied to the gate of the first ground voltage supply unit 450. When the second data setting signal READA is applied, the data transferred to the first node QA of the first register is varied according to data stored in the first node QB. That is, when a high-level data is stored in the first node QB of the second register, the first ground voltage supply unit is driven, so the ground voltage is applied to the second node QAb and a high-level data is stored in the first node QA of the first register. However, when a low-level data is stored in the first node QB of the second register, the first ground voltage supply unit is not driven, so the ground voltage is not applied and the low-level data stored in the first node QA of the first register remains intact (in the case of FIG. 6).

However when the low-voltage fixing phenomenon of the sense node has occurred, data is not changed since the first ground voltage supply unit 450 is not driven irrespective of which data is stored in the first node QB of the second register.

A program operation is performed according to data stored in the first node QA of the first register. That is, when data stored in the first node QA is a low-level data, a corresponding cell becomes a program subject, and when data stored in the first node QA is a high-level data, a corresponding cell becomes an erase subject.

In the case of FIG. 6, two kinds of data can be applied to the first node QA of the first register since the low-voltage fixing phenomenon of the sense node is not generated. However, in the case of FIG. 5, a high-level data remains stored as described above.

A verify operation for checking the program is then executed.

In the verify operation, when a to-be-programmed cell has not been programmed over a verify voltage supplied from a word line, a corresponding cell is turned on, thereby forming a current path over the cell strings. The sense node precharged with a high level is grounded to the ground terminal connected to the cell string and thus shifts to a low level. Further, in the case of a not-to-be-programmed cell, a current path is formed and the sense node shifts to a low level because the threshold voltage of a corresponding cell will be a verify voltage or less. Accordingly, data that is first stored remains intact.

However, when a to-be-programmed cell has been programmed over a verify voltage, a corresponding cell is turned off, thereby shutting off the formation of a current path. The sense node maintains a high-level voltage. When the second data transfer signal READA is applied, a low-level data that has been stored upon program changes to a high-level data.

When verification is completed, data stored in the first node QA is a high-level data irrespective of whether a corresponding cell is a program subject. As described above, in the case of a to-be-erased cell, the sense node maintains a low level and therefore a high-level data that was first stored remains intact. Further, in the case of a to-be-programmed cell, when the cell has been programmed, the sense node shifts to a high level and, therefore, a low-level data that was first stored changes to a high level. Accordingly, if a high-level data is set in the first nodes of the first registers of the page buffers, verification is completed.

FIG. 6 corresponds to a normal case where the low-voltage fixing phenomenon of the sense node has not been generated. In this case, after verification is completed, a high-level data is stored.

FIG. 5 corresponds to a case where the low-voltage fixing phenomenon of the sense node has occurred. However, a high-level voltage is previously set in the first node QA of the first register so that a verify completion signal is output.

This can be described as follows more clearly.

Figure 7:
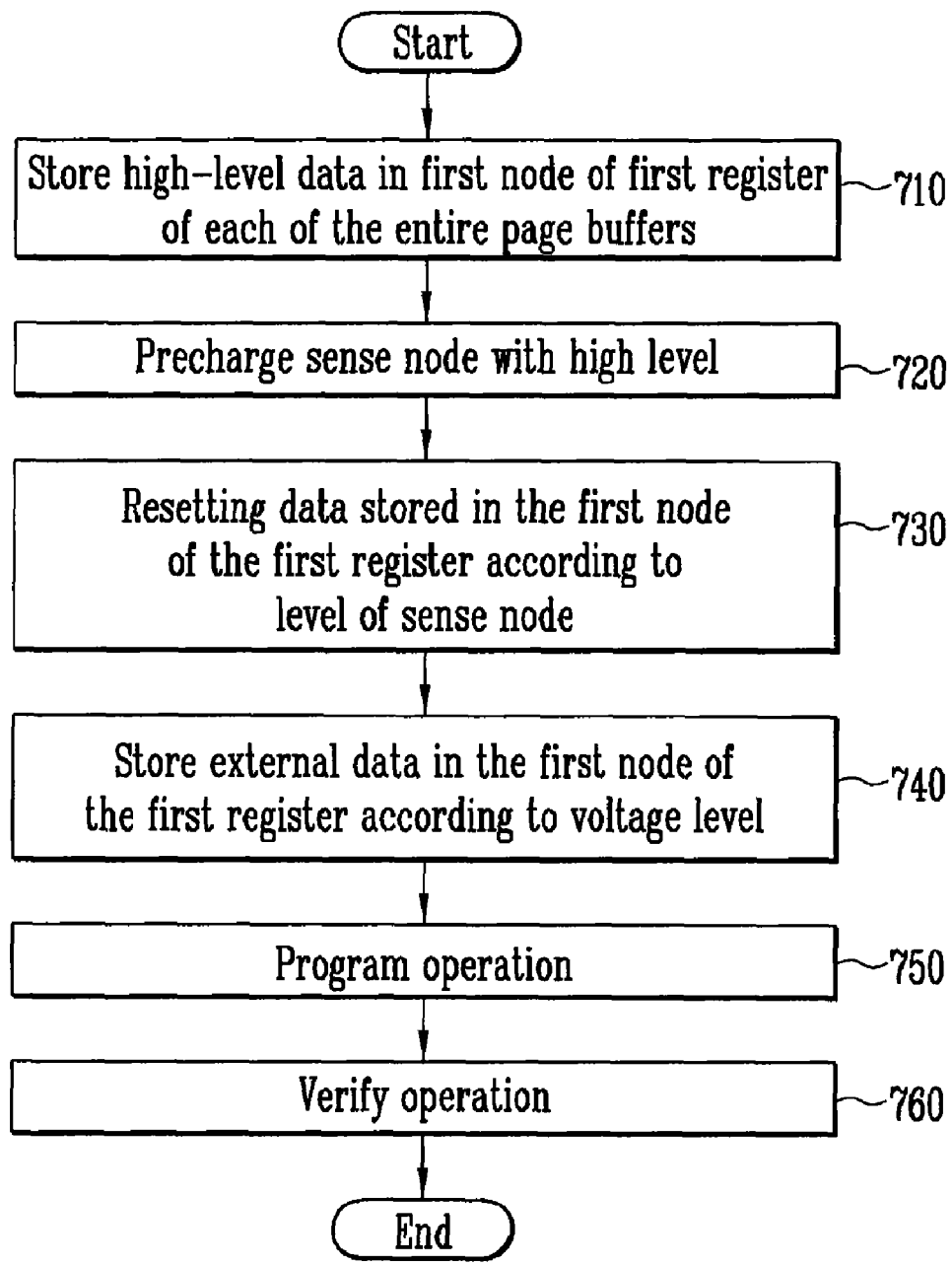
FIG. 7 is a flowchart illustrating a method of programming the non-volatile memory device according to an embodiment of the present invention.

FIG. 7 is a flowchart illustrating a method of programming the non-volatile memory device according to an embodiment of the present invention.

A high-level data is first stored in the first nodes QA of the first registers of the page buffers at step 710.

As described above, the ground voltage is applied to the second node QAb of the first register through the second ground voltage supply unit 460.

The sense node is precharged with a high level at step 720.

In the case of a normal page buffer, the sense node will be precharged with a high level. However, in the case of a page buffer in which the low-voltage fixing phenomenon of the sense node is generated, a low-level voltage will be maintained even by precharge.

Data stored in the first node QA of the first register is then reset according to a voltage level of the sense node at step 730.

The ground voltage is applied to the first node of the first register through the first ground voltage supply unit 450. The first ground voltage supply unit 450 supplies the ground voltage according to a voltage of the sense node, unlike the second ground voltage supply unit 460.

External data is stored in the first node of the first register according to a voltage level of the sense node at step 740.

External data is stored in the first node of the second register and the sense node is precharged with a high level. In the same manner as described above, in the case of a normal page buffer, the sense node will be precharged with a high level. However, in the case of a page buffer in which the low-voltage fixing phenomenon of the sense node is generated, a low-level voltage will be maintained even by precharge.

The external data stored in the first node of the second register is applied to the sense node and the ground voltage is applied to the second node of the first register through the first ground voltage supply unit.

A program operation is then executed according to the data stored in the first node of the first register at step 750.

It is checked whether the program operation has been completed at step 760. In the present invention, although the low-voltage fixing phenomenon of the sense node is generated, a high-level voltage is applied to the first node of the first register. However, a verification fail will not be generated.

According to the present embodiment, the present invention further includes the second ground voltage supply unit for supplying the ground voltage to each data setting unit irrespective of a voltage level of the sense node. Accordingly, verification can be completed even when the low-voltage fixing phenomenon of the sense node is generated.

As described above, according to the present invention, the problems due to the low-voltage fixing phenomenon of the sense node can be solved. That is, data stored in the register of the page buffer is changed irrespective of a level of the sense node. It is therefore possible to prevent verification failure, which may occur due to the low-voltage fixing phenomenon of the sense node in a verify operation.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A page buffer, comprising:
   a bit line select unit for selectively connecting a bit line connected to a specific cell to a sense node;
   a first register and a second register for temporarily storing data to be programmed into the specific cell and temporarily storing data read from the specific cell;
   a first ground voltage supply unit for applying a ground voltage to the first register and the second register according to a level of the sense node; and
   a second ground voltage supply unit for applying the ground voltage to the first register and the second register according to a control signal.

2. The page buffer of claim 1, wherein the second ground voltage supply unit includes a NMOS transistor connected between a ground terminal and a connection node of the first and second registers.

3. The page buffer of claim 1, wherein the first ground voltage supply unit and the second ground voltage supply unit are connected in parallel between a ground terminal and a connection node of the first and second registers.

4. A method of programming a non-volatile memory device, the method comprising:
   storing a high-level data in a first node of a first register of each of a plurality of page buffers by supplying a ground voltage to a second node of the first register through a second ground voltage supply unit for applying the ground voltage to the first register and a second register irrespective of a level of a sense node;
   precharging the sense node with a high level;
   resetting the data stored in the first node of the first register according to a voltage level of the sense node;
   precharging the sense node with a high level;
   storing external data in the first node of the first register according to a voltage level of the sense node; and
   performing a program operation according to the data stored in the first node of the first register.

5. The method of claim 4, wherein resetting the data stored in the first node of the first register further comprises supplying a ground voltage to the first node of the first register through a first ground voltage supply unit for supplying the ground voltage to the first register and a second register according to a level of the sense node.

6. The method of claim 4, wherein storing the external data in the first node of the first register further comprises:
   storing the external data in a first node of a second register;
   precharging the sense node with a high level;
   applying the external data stored in the first node of the second register to the sense node; and
   supplying a ground voltage to a second node of the first register through a first ground voltage supply unit for applying the ground voltage to the first and second registers according to a level of the sense node.

7. The method of claim 4, further comprising verifying whether program has been completed according to the data stored in the first node of the first register.

* * * * *